(12) United States Patent
Bachmaier et al.

(10) Patent No.: US 7,772,105 B2
(45) Date of Patent: Aug. 10, 2010

(54) SEMICONDUCTOR COMPONENT WITH PLASTIC HOUSING, AND PROCESS FOR PRODUCING THE SAME

(75) Inventors: Ulrich Bachmaier, Ruderting (DE); Michael Bauer, Nittendorf (DE); Robert Christian Hagen, Sarching (DE); Jens Pohl, Bernhardswald (DE); Rainer Steiner, Regensburg (DE); Peter Strobel, Regensburg (DE); Hermann Vilsmeier, Regensburg (DE); Holger Woerner, Regensburg (DE); Bernhard Zuhr, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 207 days.

(21) Appl. No.: 11/925,117

(22) Filed: Oct. 26, 2007

(65) Prior Publication Data

US 2008/0050907 A1 Feb. 28, 2008

Related U.S. Application Data

(62) Division of application No. 11/246,545, filed on Oct. 11, 2005, now Pat. No. 7,327,023.

(30) Foreign Application Priority Data

Oct. 11, 2004 (DE) .................. 10 2004 049 654

(51) Int. Cl.
*H01L 21/44* (2006.01)
(52) U.S. Cl. .................. 438/612; 257/E21.508; 257/E21.506

(58) Field of Classification Search .......... 257/E21.502, 257/E21.506, E21.508; 438/612, 617
See application file for complete search history.

(56) References Cited

U.S. PATENT DOCUMENTS

| 5,907,190 | A | 5/1999 | Ishikawa et al. |
| 6,093,584 | A | 7/2000 | Fjelstad |
| 6,278,176 | B1 | 8/2001 | Nakamura et al. |
| 6,465,742 | B1 | 10/2002 | Hiraoka et al. |
| 7,005,325 | B2 * | 2/2006 | Chow et al. ................. 438/123 |
| 7,036,573 | B2 * | 5/2006 | Koning et al. ............... 165/185 |
| 7,312,103 | B1 * | 12/2007 | Huemoeller et al. ........ 438/106 |
| 7,434,310 | B2 * | 10/2008 | Dean et al. .................... 29/847 |
| 7,554,196 | B2 * | 6/2009 | Bachmaier et al. .......... 257/729 |
| 2003/0030143 | A1 | 2/2003 | Wennemuth et al. |
| 2004/0089944 | A1 * | 5/2004 | Watanabe .................... 257/734 |

FOREIGN PATENT DOCUMENTS

| DE | 10137346 | 2/2003 |
| WO | 2005081316 A2 | 9/2005 |

* cited by examiner

*Primary Examiner*—Jarrett J Stark
(74) *Attorney, Agent, or Firm*—Edell, Shapiro & Finnan, LLC

(57) ABSTRACT

A semiconductor component includes a plastic housing including: plastic outer surfaces; lower outer contact surfaces arranged on an underside of the housing; upper outer contact surfaces arranged on a top side of the housing that is opposite the underside; and outer interconnects electrically connecting the lower outer contact surfaces to the upper outer contact surfaces, the outer interconnects including a layer of solder arranged on conduction paths along an outer contour of the housing.

8 Claims, 3 Drawing Sheets

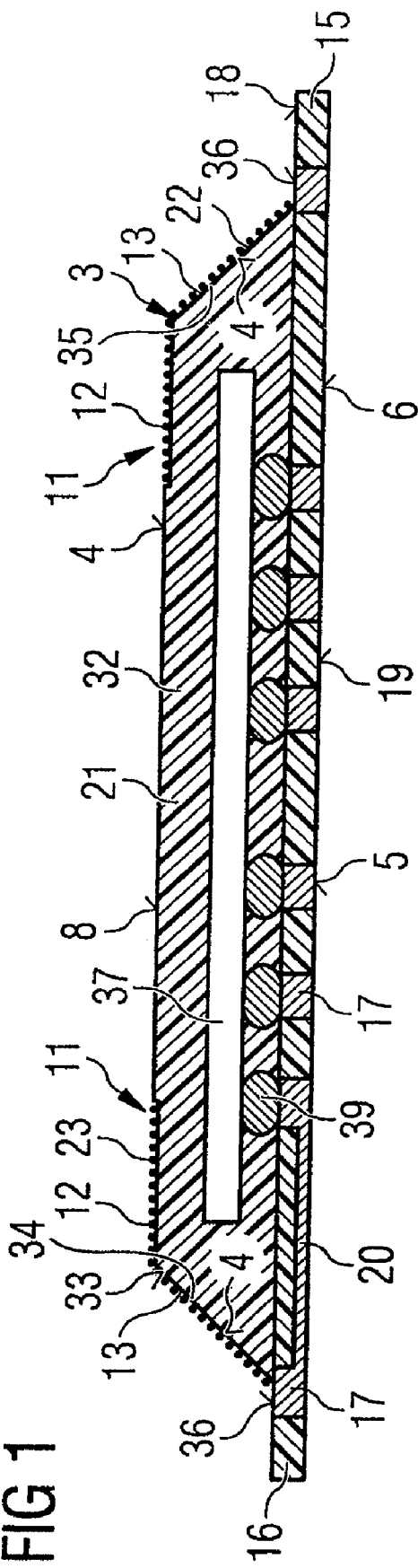

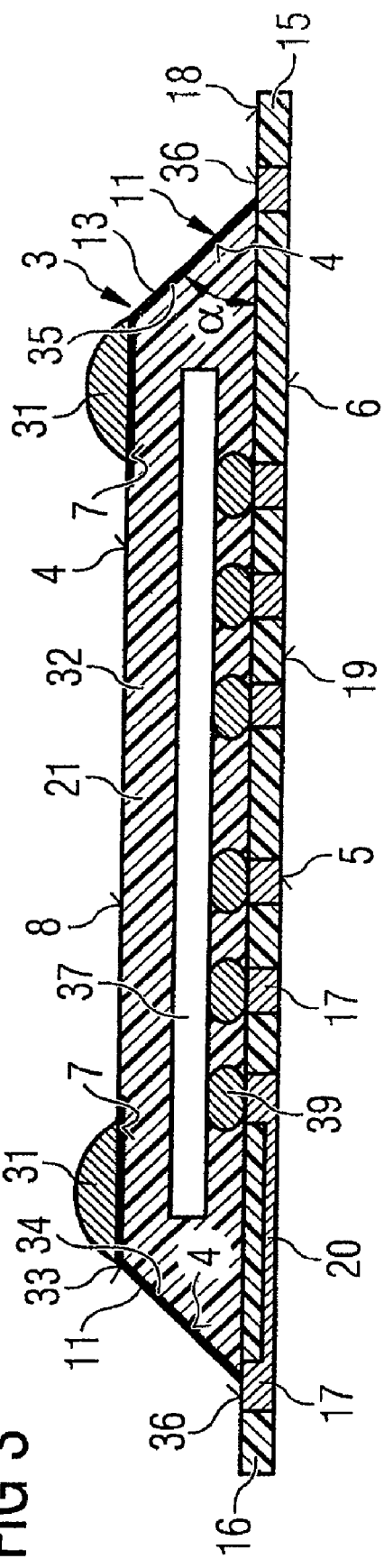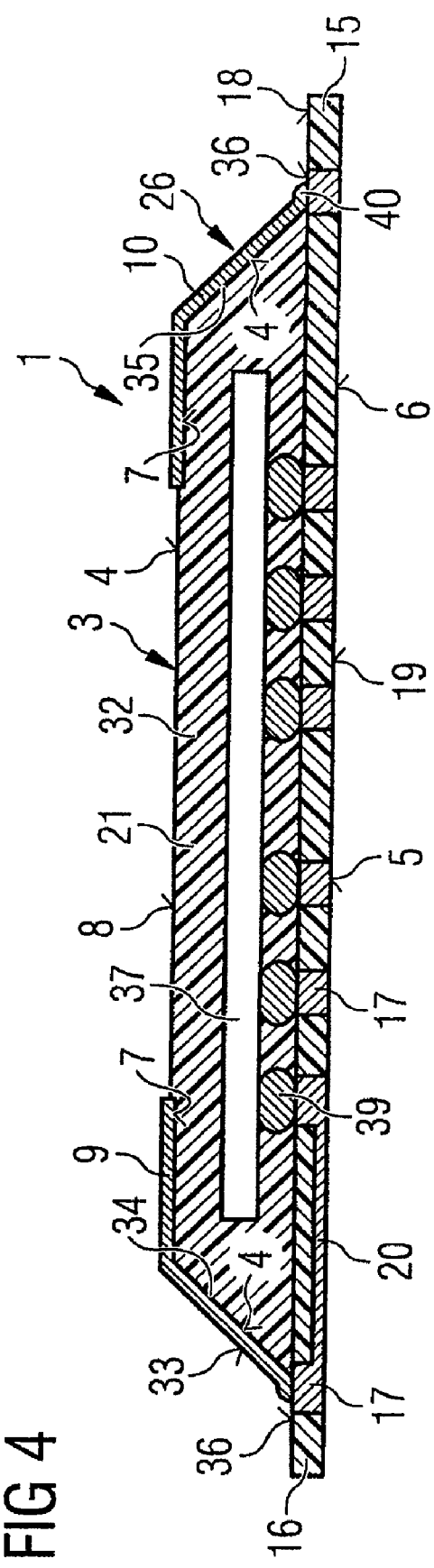

SEMICONDUCTOR COMPONENT WITH PLASTIC HOUSING, AND PROCESS FOR PRODUCING THE SAME

CROSS REFERENCE TO RELATED APPLICATIONS

This application is a divisional application of prior application Ser. No. 11/246,545, filed Oct. 11, 2005, which claims priority under 35 U.S.C. §119 and/or 365 to German Application No. DE 10 2004 049 654.4 filed on Oct. 11, 2004, entitled "Semiconductor Component With Plastic Housing, And Process For Producing It," both of which are hereby incorporated by reference in their entireties.

FIELD OF THE INVENTION

The invention relates to a semiconductor component with a plastic housing and to a process for producing it. In particular, the invention relates to a semiconductor component arrangement for stacking semiconductor components with at least one semiconductor base component. The semiconductor base component has a housing which includes plastic outer surfaces. Outer contact surfaces for the application of outer contacts are arranged on an underside of the housing, and outer contact surfaces for the stacking of a semiconductor component on the plastic housing of the semiconductor base component are arranged on a top side of the housing, which is the opposite side from the underside.

BACKGROUND

Conventional semiconductor base components, as are known from German patent publication No. DE 101 38 278, for the stacking of BGA or LBGA housings (ball grid array or large ball grid array), are provided with additional flexible rewiring sheets which have a larger area than the semiconductor components to be stacked and project beyond the edge of the semiconductor components, so that they can be bent toward a semiconductor component of a semiconductor component stack arranged below and can be electrically connected to the semiconductor component arranged below via the flexible sheet.

A semiconductor module with semiconductor components stacked in this way has the drawback that the semiconductor components cannot be stacked within the minimum possible space, especially since the bent rewiring sheet also requires a minimum bending radius, without which there is a risk of microcracks forming in the rewiring lines arranged on the rewiring sheet. Other conventional semiconductor base components have a rewiring substrate with outer contacts arranged on the underside of the rewiring substrate, and at least one semiconductor chip or a memory component, such as a DRAM (dynamic random access memory), is arranged in the center of the rewiring substrate, on the top side of the rewiring substrate.

If a conventional semiconductor component of this type is to be used as the semiconductor base component for a semiconductor module, only the edge regions of the rewiring substrate can be made available for the application of outer contacts of a stacked semiconductor component, as has been described in German patent application DE 10 2004 009 056. Since the center of the rewiring substrate is taken up by the semiconductor chip, the number and arrangement of outer contacts in the semiconductor component to be stacked are greatly restricted, and consequently a large number of known housing types, such as BGA or LBGA housings, cannot be stacked on a conventional semiconductor component with rewiring substrate of this type.

SUMMARY

The invention relates to a semiconductor component with a rewiring substrate and a process for producing it, which can be used as a semiconductor base component. The invention further provides a semiconductor component in which any desired arrangement of outer contact surfaces can be provided on the top side, and a distribution of outer contact surfaces on the underside of the wiring substrate for a surface-mountable semiconductor component which is independent of the arrangement of the outer contact surfaces on the top side is possible. The invention minimizes the space and area taken up by a semiconductor component, in particular, to reduce the space taken up by a memory module composed of DRAM semiconductor components.

According to an exemplary embodiment, a semiconductor component includes a housing comprising plastic outer surfaces, which is equipped with lower outer contact surfaces arranged on an underside of the housing and with upper outer contact surfaces arranged on a top side of the housing that is the opposite side from the underside. To produce the connection between the upper outer contact surfaces and the lower outer contact surfaces, the plastic housing has outer interconnects. These outer interconnects have a layer of solder that is arranged on conduction paths along the housing outer contour.

This semiconductor component has the advantage that there is no need for any additional intermediate wiring substrates or rewiring sheets to connect the outer contact surfaces on the top side to the outer contact surfaces on the underside. Rather, the housing outer contour is utilized to produce conduction paths on the plastic outer surfaces of the housing outer contour, which conduction paths are thickened with the aid of a layer of solder to form interconnects. Therefore, the plastic housing compound or the plastic outer surfaces are used to generate conduction paths. The space required to provide outer contact surfaces on the top side of the semiconductor component and to apply interconnects along the outer contour of the plastic housing with electrical connection to the outer contacts on the underside is thereby reduced. Moreover, the plastic housing per se already forms the substrate material for these interconnects and therefore performs a dual function, in that on the one hand the plastic housing embeds the components of the semiconductor chip and on the other hand on its plastic outer surfaces offers the possibility of electrically connecting upper outer contact surfaces to lower outer contact surfaces.

This does not require the conduction paths already to have a continuous metallization. Rather, a preferred embodiment of the invention provides a conduction path comprising particles of the plastic outer surfaces of the housing which are isolated from one another, and can be wetted by liquid solder material and are provided along a conductor path structure on the plastic outer surfaces. The particles which can be wetted by solder material are arranged so close together in the region of the conduction paths that a liquid solder material can spread out or flow along these conduction paths made up of electrically conductive particles that are isolated from one another. This embodiment of the invention has the advantage that only electrically conductive particles need to be arranged distributed within the plastic housing compound and are partially uncovered to form conduction paths while remaining partially anchored in the plastic housing compound. Consequently, the conducting particles not only form wettable support points for the solder material but at the same time also anchor the solder material of the interconnects along the housing outer contour.

In a further embodiment of the invention, the conduction paths comprise a metal layer which is a few nanometers thick and can be wetted by liquid solder material. This wettable metal layer is arranged along the housing outer contour on the plastic outer surfaces of the housing. A metallic layer which is a few nanometers thick of this type as conduction path can be applied to the plastic outer surfaces of the housing with the aid of sputtering, vapor deposition or plasma deposition.

In a further variant of the conduction paths, these conduction paths may comprise individual, wettable bonding wires, which are arranged from outer contact surfaces on the top side of the plastic housing to contact terminal surfaces of a wiring substrate and are thickened with the aid of a liquid solder material, in such a manner that they bear closely against the plastic housing along the housing outer contour.

If these bonding wires as conduction paths for liquid solder material are arranged next to one another in pairs, it is possible to create supply current paths or supply current interconnects via these bonding wires arranged in pairs with a strip of solder material arranged between them, and these supply current paths or supply current interconnects are suitable for increasing the supply of current to the semiconductor chips.

In a further preferred embodiment of the invention, the housing comprises a wiring substrate on its underside. This wiring substrate comprises through-contacts arranged on its edge regions. On the top side of the wiring substrate, these through-contacts form contact terminal surfaces which are electrically connected to the outer interconnects on the housing outer contour of the plastic housing. On the underside of the wiring substrate, the through-contacts are electrically connected, via a wiring structure, to the corresponding lower outer contact surfaces. This embodiment of the invention has the advantage that the larger interconnects do not have to be guided around the semiconductor housing, but rather they can end at the contact terminal surfaces on the top side of the wiring substrate, which are formed by the through-contacts. This increases the reliability of the structure of outer interconnects of this type on the outer plastic sides of the semiconductor component housing.

A further embodiment of the invention provides for the plastic of the housing to comprise inclusions of an organometal compound. The metallic constituents of this organometal compound are freely accessible and open in the conduction paths, such that they can be wetted by solder material, and are then wetted by solder material. The advantage of this embodiment of the invention is that the metallic constituents in the conduction paths on the outer sides of the semiconductor housing can be uncovered by the action of radiation, so that any desired conduction path arrangements can be realized with the aid of irradiation technology. The irradiation device used may be laser beams, ion beams or electron beams, in order to uncover the metallic constituents of the organometal compounds for the conduction paths on the top side of the plastic housing compound.

In a further embodiment of the invention, it is provided that the plastic of the housing comprises inclusions of electrically conductive nanoparticles. These nanoparticles are arranged partially uncovered in the paths and can be wetted by liquid solder material. Nanoparticles of this type may be fullerenes, which have a hollow sphere of hexagonally arranged carbon atoms. These fullerenes in hollow sphere form are arranged in a concentration in the plastic housing compound which is such that they do not cause an electrical short circuit within the plastic housing compound. On the other hand, the density of the fullerenes is sufficient for them to be partially uncovered in the intended conduction paths given a suitable irradiation treatment, so that they are available for coating with solder material.

In addition to the fullerenes, nanoparticles of this type may also include nanotubes, which have a diameter of only a few nanometers but, as multi-walled nanotubes, may be up to a few millimeters long. Parts of these nanotubes are anchored in the plastic housing compound, whereas these nanotubes are uncovered on the outer sides of the plastic housing in the region of the conduction paths, so that they form wetting and anchoring points for the soldering material.

The preparation of the wiring paths may include preparation of outer contact surfaces on the top side of the plastic housing compound, so that after wetting with solder material on the top side, not only interconnects are formed, but also outer contact surfaces of a suitable size, the size and arrangement of which are matched to the size and arrangement of outer contacts for stacked semiconductor components. This has the advantage that no additional deposition processes are required for arranging the outer contacts on the top side of the plastic housing, but rather the solder material can be positioned on the prepared outer contact surface regions of the plastic housing compound.

A further aspect of the invention relates to a semiconductor module with a semiconductor base component and at least one semiconductor component stacked on top of it, the semiconductor base component of the stack being a semiconductor component in accordance with the explanations given above. A semiconductor base component of this type has the advantage that semiconductor components using BGA housing technology and/or LBGA housing technology can be stacked on top of one another in a space-saving manner. For this purpose, it is merely necessary to provide the plastic housing compound with corresponding metallic inclusions, or to prepare a corresponding conduction path structure on the plastic outer sides of the semiconductor component, in order for this then to be thickened by means of a solder technology to form corresponding interconnects.

In a further embodiment of the invention, the stacked semiconductor component has surface-mountable contacts. Components of this type having surface-mountable outer contacts have hitherto been stackable only if surface-mountable outer contacts of this type are arranged in the edge regions of the semiconductor components to be stacked. With the semiconductor component according to the invention, which can be used here as a semiconductor base component, it is possible to provide surface-mountable outer contacts for the stacked semiconductor component to be distributed evenly over its underside.

It is therefore also possible to provide modern memory components using BGA and/or LBGA housing technology in the semiconductor component, in which case it is preferable for the memory components provided to be DRAMs and/or GDRAMs. This has the advantage that it is possible to increase the storage capacity and storage density in order thereby to realize memory components which have a storage capacity of several gigabits.

In a further preferred embodiment of the invention, it is provided that the semiconductor module comprises at least one logic component, preferably an MPCP (microprocessor chip package) and a memory component, preferably a DRAM (dynamic random access memory) or a GDRAM (graphic dynamic random access memory). On account of the compact design of the semiconductor module according to the invention in the form of a semiconductor component stack, it is possible to provide memory modules which allow a high access rate in the gigahertz range.

A process for producing a semiconductor component with a plastic housing which has outer interconnects, via which lower outer contact surfaces and upper outer contact surfaces are electrically connected, comprises the following process. After a semiconductor component with a plastic housing is produced, a structure of conduction paths which can be wetted by liquid solder material is realized on the plastic outer surfaces of the housing along the housing contour between the lower outer contact surfaces and the upper outer contact surfaces. Finally, a solder deposit is applied to the upper outer contact surfaces. Then, the solder material of the solder deposit is liquefied, and it wets or coats the prepared conduction paths with solder material and in the process forms outer interconnects for connecting the lower outer contact surfaces to the upper outer contact surfaces.

This process has the advantage that a base semiconductor component which functions reliably and is suitable for stacking semiconductor modules can be created using simple mechanisms and a process which can be implemented on an industrial scale. In this context, a core point of the process is the production of structures which realize conduction paths that can be wetted by liquid solder material on the plastic outer sides. For this purpose, in a preferred implementation example of the process, a correspondingly high proportion of electrically conductive particles which are wettable by solder material is admixed to the plastic housing compound.

Electrically conductive particles of this type may be the metallic constituents of an organometal compound or electrically conductive nanoparticles, such fullerenes or carbon nanotubes, or alternatively large crystal particles, of a size of a few micrometers, which are added to the plastic housing compound as metallic filler. If materials of this type are present in the plastic housing compound, it is possible for the structure of conduction paths which can be wetted by liquid solder material to be produced on the plastic outer surfaces of the housing between lower outer contact surfaces and upper outer contact surfaces by radiation treatment. The partial uncovering of the metallically conducting inclusions in the plastic compound in the region of the conduction paths can be achieved by radiation by photons, ions and/or electrons. This may involve partial evaporation of the plastic housing compound to uncover the electrically conducting inclusions. On the other hand, in particular in the case of organometal compounds, it is possible to expose the metal atoms by thermal irradiation.

In a further preferred implementation example of the process according to the invention, to produce a structure of conduction paths which can be wetted by liquid solder material, it is possible to selectively apply a metal layer, which is a few nanometers thick and can be wetted by liquid solder material, to plastic outer surfaces of the housing between lower outer contact surfaces and upper outer contact surfaces. Sputtering techniques, vapor deposition techniques and/or plasma deposition techniques can be used for this purpose, the intention being for the plastic outer sides of the housing which are not to be covered by the metal layer to be protected from coating with metal by a photolithography technique carried out on a photoresist structure.

The outer contact surfaces on the top side of the plastic housing can be used to apply the solder deposits, from which the interconnects are then formed along the conductor paths. After the solder material of the solder deposits has been liquefied, these solder deposits wet the conducting particles of the conduction paths and coat the conduction paths to form interconnects of solder material. The solder deposits can advantageously be applied to the outer contact surfaces on the top side of the plastic housing at low cost by dispensing, jet printing or stencil printing.

To summarize, the process of the invention can produce a semiconductor base component which facilitates the stacking of semiconductor modules, provides great flexibility for the customer when using semiconductor chips from various manufacturers, and alleviates the problem of having to discard an entire module if individual semiconductor chips are defective by virtue of the fact that it is now possible for individual semiconductor components to be removed in order for a module to be repaired. Furthermore, the subject matter of the invention has the advantage that it is possible to use extremely thin semiconductor chips, with a thickness of a few tens of micrometers, and extremely minimal mold caps.

Further, interconnects can be produced on the outer side of a plastic housing at low cost by sputtering or a laser patterning process of conductive particles present in the plastic housing compound or by external bonding wire connection. In this case, it is advantageously possible to use inexpensive standard process, which means that there is no need for a complex technology involving through-contacts through the semiconductor chip or through the plastic housing compound. Furthermore, there is no need for an electroplating process, which is standard for other semiconductor base components, since in this case, to produce electrical connections between the outer contact surfaces of the wiring substrate and the top side of the plastic housing, a reliable electrical connection can advantageously be created by simple positioning of solder deposits.

BRIEF DESCRIPTION OF THE DRAWINGS

FIG. 1 shows a diagrammatic cross section through a semiconductor component with plastic housing, which along its housing outer contours has conduction paths of a first embodiment of the invention.

FIG. 2 shows a diagrammatic cross section through a semiconductor component with plastic housing, which along its housing outer contours has conduction paths of a second embodiment of the invention.

FIG. 3 shows a diagrammatic cross section through a semiconductor component with plastic housing, which has solder deposits on the top side of the housing and has conduction paths as shown in FIG. 1 or FIG. 2 on its edge sides.

FIG. 4 shows a diagrammatic cross section through a semiconductor component as shown in FIG. 3 after the solder material of the solder deposits has spread out along the conduction paths as shown in FIG. 1 or FIG. 2.

DETAILED DESCRIPTION

Figure 5:
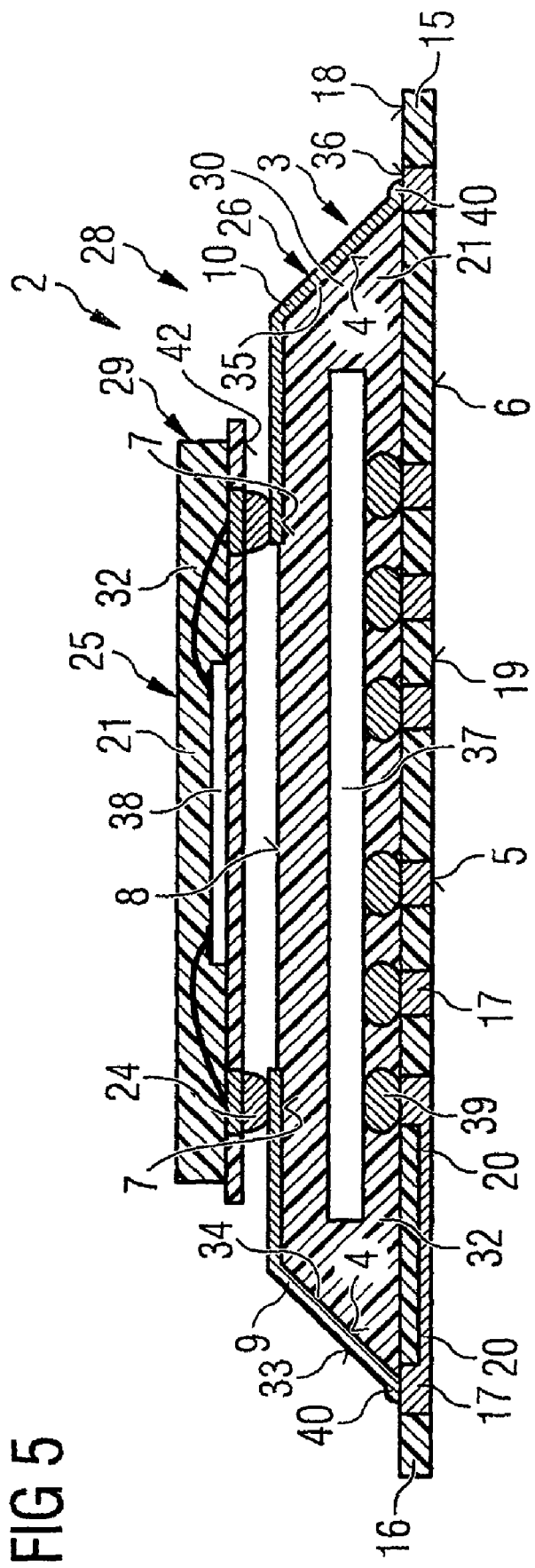
FIG. 5 shows a diagrammatic cross section through a semiconductor component stack which includes a semiconductor component as shown in FIG. 4 as semiconductor base component and also a stacked semiconductor component with surface-mountable outer contacts.

FIG. 1 shows a diagrammatic cross section through a semiconductor component I with a plastic housing 3, which along its housing outer contours 33 has conduction paths 11 of a first embodiment of the invention. In this first embodiment of the invention, these conduction paths 11 are not continuous metal strips, but rather comprise individual, electrically conducting inclusions 22 and/or spots that are isolated from one another and can be wetted by a solder material. In this first embodiment of the conduction paths 11, these wettable points of the interconnects are formed by virtue of the plastic 21 of the housing 3 having electrically conducting particles 12, preferably with metallic constituents 23, which are distributed through the volume of the plastic compound 32 and have been uncovered along the predetermined conduction paths 11 on the plastic outer surfaces 4 of the housing 3 by suitable processing.

Between the conduction paths 11, the plastic outer surfaces 4 remain unaffected by the uncovering step, so that the conduction paths 11, of which in this instance two extend from the top side 8 of the plastic housing 3 along the edge sides 34 and 35 as far as contact terminal surfaces 36 of a substrate 15 which supports the plastic housing. The areal extent of the substrate 15 is larger than that of a semiconductor chip 37 which is electrically connected to through-contacts 17 of the wiring substrate 15 by way of flip chip contacts 39. The through-contacts 17 of the substrate 15 have lower outer contact surfaces 5 on the underside 6 of the plastic housing 3, which simultaneously forms the underside 19 of the wiring substrate 15.

The lower outer contact surfaces 5 are connected via a wiring structure 20 to through-contacts 17 in the edge regions 16 of the wiring substrate 15. Therefore, the contact terminal surfaces 36 on the edge sides 16 of the wiring substrate 15 form a node at which the conduction paths 11, the outer contact surfaces 5 and the flip chip contacts 39 are electrically connected to one another by way of the through-contacts 17 arranged in the edge sides 16. In this first embodiment, however, the conduction paths 11 do not yet provide an electrical connection from the contact terminal surfaces 36 of the wiring substrate 15 to the top side 8 of the housing 3 while the conduction paths 11 and their electrically conducting inclusions or particles are not electrically connected to form interconnects.

FIG. 2 shows a diagrammatic cross section through a semiconductor component I with plastic housing 3 which has conduction paths 41 of a second embodiment of the invention along its housing outer contours 33. Components with the same functions as in FIG. 1 are denoted by the same reference numerals and are not explained further. In this embodiment of the conduction paths 41, the latter have a thin metal layer 14 which is a few nanometers thick and are arranged in a conductor path structure 13 on the top side 8 of the housing 3 and on the edge sides 34 and 35 of the housing 3. On the top side 8 of the housing 3, the conduction paths 41 have upper outer contact surfaces 7 on their ends and extend beyond the edge sides 34 and 35 as far as contact terminal surfaces 36, which are arranged on the top side 18 of the wiring substrate 15 in the edge regions 16.

FIG. 3 shows a diagrammatic cross section through a semiconductor component 1 with plastic housing 3, which has solder deposits 31 on the top side 8 of the housing 3 and has conduction paths 11 as shown in FIG. 1 or 41 as shown in FIG. 2 on its edge sides 34 and 35. These solder deposits 31 may be limited to the top outer contact surfaces 7 of the semiconductor material or, as shown in FIG. 3, may also extend over the entire conduction path structure 13 on the top side 8 of the housing 3. These solder deposits 31 can be applied using various techniques, preferably by a stencil printing technique or by jet printing technology.

The distribution of the solder material over the conduction path structure 13 can be carried out for the entire conduction path structure 13 in a suitable furnace, in which the solder deposit 31 is melted and the solder material is distributed uniformly along the conduction path structure 13 on the conduction paths 41. To promote the uniform distribution of the solder material, the edge sides 34 and 35 are inclined with respect to the horizontal, preferably with an angle of inclination $\alpha$ of <60°.

FIG. 4 shows a diagrammatic cross section through a semiconductor component I as shown in FIG. 3 after the solder material of the solder deposits 31 has spread out along the conduction paths 11 or 41 as shown in FIG. 1 or 2, respectively. Components with the same functions as in the preceding figures are denoted by the same reference numerals and are not explained again.

On account of the solder material spreading out along the conduction paths 11 or 41, as shown in FIG. 1 or FIG. 2, respectively, outer interconnects 9 comprising a layer of solder 10 have now formed on the conduction paths 11 or 41. The outer interconnects 9 extend from upper outer contact surfaces 7 as far as the contact terminal surfaces 36, on which minimal new solder deposits 40 have formed. These solder deposits 40 on the contact terminal surfaces 36 on the top side 18 of the wiring substrate 15 are responsible for intensive contact between the outer interconnects 9 on the plastic outer surfaces 4 of the plastic housing 3 and the contact terminal surfaces 36 of the wiring substrate 15. Therefore, the outer upper outer contact surfaces 7 are electrically connected to the lower outer contact surfaces 5 via the through-contacts 17 and a wiring structure 20 on the underside 19 of the wiring substrate 15.

Since the lower outer contact surfaces 5 are connected to flip chip contacts 39 of the semiconductor chip 37 via through-contacts 17, the semiconductor component I according to the invention provides the possibility of using this semiconductor component 1 as the base semiconductor component for a stack of semiconductor components. For this purpose, it is advantageous that the upper outer contact surfaces 7 can be arranged in any desired way on the top side 8 of the plastic housing 3 and their size can be matched to outer contacts of a semiconductor component which is to be stacked.

FIG. 5 shows a diagrammatic cross section through a semiconductor component stack 2, which as semiconductor base component 26 has a semiconductor component I as shown in FIG. 4 and also has a stacked semiconductor component 25 with a semiconductor chip 38 and with surface-mountable outer contacts 24. This semiconductor stack 2 forms a semiconductor module 28 of a logic component 29, which on its edge regions of the underside 42 has the outer contacts 24. The upper outer contact surfaces 7 of the outer interconnects 9 of the semiconductor base component 26 are arranged in a corresponding way. In this semiconductor module 28, the semiconductor base component 26 is formed by a memory component 30, which is electrically connected to the stacked semiconductor component 25 via the outer interconnects 9.

Having described preferred embodiments of new and improved semiconductor component with a plastic housing, and corresponding process for producing the semiconductor component, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A method for producing a semiconductor component with a plastic housing including outer interconnects that electrically connect lower outer contact surfaces and upper outer contact surfaces, the method comprising:

producing a semiconductor component with a plastic housing that embeds the semiconductor component such that the plastic housing extends over upper and lower outer surfaces of the semiconductor component;

producing a structure of conduction paths on plastic outer surfaces of the plastic housing along an outer contour of the plastic housing between the lower outer contact surfaces and the upper outer contact surfaces, the conduction paths being isolated from one another by regions of plastic of the plastic housing and being wettable by liquid solder material;

applying solder deposits to the upper outer contact surfaces;

liquefying the solder material of the solder deposits so as to wet and coat the conductions paths with solder material to form outer interconnects between the lower outer contact surfaces and the upper outer contact surfaces; and admixing particles that are wettable by liquid solder material to a plastic compound to produce a structure of the conduction paths that is wettable by liquid solder material.

2. A method for producing a semiconductor component with a plastic housing including outer interconnects that electrically connect lower outer contact surfaces and upper outer contact surfaces, the method comprising:

producing a semiconductor component with a plastic housing that embeds the semiconductor component such that the plastic housing extends over upper and lower outer surfaces of the semiconductor component;

producing a structure of conduction paths on plastic outer surfaces of the plastic housing along an outer contour of the plastic housing between the lower outer contact surfaces and the upper outer contact surfaces, the conduction paths being isolated from one another by regions of plastic of the plastic housing and being wettable by liquid solder material;

applying solder deposits to the upper outer contact surfaces;

liquefying the solder material of the solder deposits so as to wet and coat the conductions paths with solder material to form outer interconnects between the lower outer contact surfaces and the upper outer contact surfaces; and admixing inclusions of nanoparticles to a plastic compound to produce a structure of the conduction paths that is wettable by liquid solder material.

3. A method for producing a semiconductor component with a plastic housing including outer interconnects that electrically connect lower outer contact surfaces and upper outer contact surfaces, the method comprising:

producing a semiconductor component with a plastic housing that embeds the semiconductor component such that the plastic housing extends over upper and lower outer surfaces of the semiconductor component;

producing a structure of conduction paths on plastic outer surfaces of the plastic housing along an outer contour of the plastic housing between the lower outer contact surfaces and the upper outer contact surfaces, the conduction paths being isolated from one another by regions of plastic of the plastic housing and being wettable by liquid solder material;

applying solder deposits to the upper outer contact surfaces;

liquefying the solder material of the solder deposits so as to wet and coat the conductions paths with solder material to form outer interconnects between the lower outer contact surfaces and the upper outer contact surfaces; and admixing inclusions of an organometal compound to a plastic compound to produce a structure of the conduction paths that is wettable by liquid solder material.

4. A method for producing a semiconductor component with a plastic housing including outer interconnects that electrically connect lower outer contact surfaces and upper outer contact surfaces, the method comprising:

producing a semiconductor component with a plastic housing that embeds the semiconductor component such that the plastic housing extends over upper and lower outer surfaces of the semiconductor component;

producing a structure of conduction paths on plastic outer surfaces of the plastic housing along an outer contour of the plastic housing between the lower outer contact surfaces and the upper outer contact surfaces, the conduction paths being isolated from one another by regions of plastic of the plastic housing and being wettable by liquid solder material;

applying solder deposits to the upper outer contact surfaces;

liquefying the solder material of the solder deposits so as to wet and coat the conductions paths with solder material to form outer interconnects between the lower outer contact surfaces and the upper outer contact surfaces; and irradiating the plastic outer surfaces with photons, ions and/or electrons to produce a structure of the conduction paths that is wettable by liquid solder material.

5. The method of claim 1, further comprising:

bonding outer bonding wires to produce a structure of the conduction paths that is wettable by liquid solder material.

6. The method of claim 1, further comprising:

selectively applying a metal layer that is wettable by liquid solder material to plastic outer surfaces of the housing between the lower outer contact surfaces and the upper outer contact surfaces to produce a structure of the conduction paths that is wettable by liquid solder material.

7. The method of claim 6, further comprising:

applying the metal layer by sputtering, vapor deposition, and/or plasma deposition and patterning the metal layer via photolithography to form conductor paths.

8. The method of claim 1, wherein the solder deposits are applied by dispensing, jet printing, or stencil printing.

* * * * *